United States Patent
Yang et al.

(10) Patent No.: US 9,859,192 B2
(45) Date of Patent: Jan. 2, 2018

(54) SEMICONDUCTOR STRUCTURE WITH THROUGH-SILICON VIA

(71) Applicant: MediaTek Inc., Hsin-Chu (TW)

(72) Inventors: Ming-Tzong Yang, Baoshan Township, Hsinchu County (TW); Yu-Hua Huang, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/066,256

(22) Filed: Mar. 10, 2016

(65) Prior Publication Data

US 2016/0268183 A1    Sep. 15, 2016

Related U.S. Application Data

(60) Provisional application No. 62/132,375, filed on Mar. 12, 2015.

(51) Int. Cl.
| | |
|---|---|
| *H01L 21/70* | (2006.01) |
| *H01L 23/48* | (2006.01) |
| *H01L 27/02* | (2006.01) |
| *H01L 27/092* | (2006.01) |
| *H01L 23/532* | (2006.01) |

(52) U.S. Cl.
CPC ........ *H01L 23/481* (2013.01); *H01L 27/0207* (2013.01); *H01L 23/53295* (2013.01); *H01L 27/092* (2013.01)

(58) Field of Classification Search
CPC ............. H01L 23/481; H01L 23/53228; H01L 23/562; H01L 23/585; H01L 27/0207; H01L 27/092; H01L 29/0649
See application file for complete search history.

(56) References Cited

U.S. PATENT DOCUMENTS

| | | | | |
|---|---|---|---|---|
| 8,604,619 B2 * | 12/2013 | Hsieh | ................ | H01L 21/76898 257/621 |
| 2010/0270597 A1 * | 10/2010 | Sproch | ................ | G06F 17/5036 257/255 |
| 2013/0140680 A1 * | 6/2013 | Harada | ............. | H01L 21/76898 257/621 |

* cited by examiner

*Primary Examiner* — Trung Q Dang
(74) *Attorney, Agent, or Firm* — Wolf, Greenfield & Sacks, P.C.

(57) ABSTRACT

A semiconductor structure includes a semiconductor substrate and a conductive element formed in a portion of the semiconductor substrate. The semiconductor structure further includes a plurality of insulating elements formed in portions of the semiconductor substrate at a first region surrounding the conductive element and a semiconductor device formed over a portion of the semiconductor substrate at a second region adjacent to the first region. The first region is formed between the conductive element and the second region.

22 Claims, 3 Drawing Sheets

SEMICONDUCTOR STRUCTURE WITH THROUGH-SILICON VIA

CROSS REFERENCE TO RELATED APPLICATIONS

This application claims the benefit of U.S. Provisional Application No. 62/132,375 filed Mar. 12, 2015, the entirety of which is incorporated by reference herein.

BACKGROUND OF THE INVENTION

1. Field of the Invention

The present invention relates to integrated circuits (ICs), and in particular to a semiconductor structure with a through-silicon via (TSV).

2. Description of the Related Art

Through-silicon vias (TSVs) are often used in 3D integrated circuit devices and stacked integrated circuit dies for connecting dies. Integrated circuit (IC) dies are generally formed on semiconductor wafer substrates, such as silicon wafers, and the TSVs extend through the thickness of the wafer substrate extending from one side of the substrate to the other side, thereby connecting the integrated circuits on a die to the backside of the die.

Since the TSVs are metal vias extending through the thickness of the semiconductor substrate, the presence of the TSVs induce tensile stress in the surrounding semiconductor material. This requires that the TSVs to be kept at a distance apart from device circuits in the semiconductor wafer in order to avoid degrading the device circuits' performance. The necessity to keep the device circuits away from the TSVs defines a semiconductor region around a given TSV in which no device circuits are placed, and this region is referred to as a keep-out zone. The larger the keep-out Zone, the lower the area of the semiconductor wafer for forming the device circuits.

In order to maximize the area over the semiconductor substrate for forming the device circuits, it is desired that the design of the keep-out zone be compliant with the maximum area of the device circuits utilized.

BRIEF SUMMARY OF THE INVENTION

An exemplary semiconductor structure comprises a semiconductor substrate, a conductive element formed in a portion of the semiconductor substrate and a plurality of insulating elements formed in portions of the semiconductor substrate at a first region surrounding the conductive element. The semiconductor structure further comprises a semiconductor device formed over a portion of the semiconductor substrate at a second region adjacent to the first region. The first region is formed between the conductive element and the second region.

Another exemplary semiconductor structure comprises a semiconductor substrate and a conductive element formed in a portion of the semiconductor substrate. The semiconductor structure further comprises a plurality of semiconductor sub-regions separately formed in the semiconductor substrate at a first region surrounding the conductive element and a semiconductor device formed over a portion of the semiconductor substrate at a second region adjacent to the first region. The first region is formed between the conductive element and the second region.

Yet another exemplary semiconductor structure comprises a semiconductor substrate and a conductive element formed in a portion of the semiconductor substrate. The semiconductor structure further comprises a plurality of insulating elements formed in portions of the semiconductor substrate at a first region surrounding the conductive element, and a first semiconductor element formed over a portion of the semiconductor substrate at a second region adjacent to the first region. The first region is formed between a first side of the conductive element and the second region. The semiconductor structure further comprises a second semiconductor element formed over a portion of the semiconductor substrate at a third region adjacent to the first region. The third region is formed between a second side of the conductive element and the second region. The second side is perpendicular to the first side.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

It should be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1:
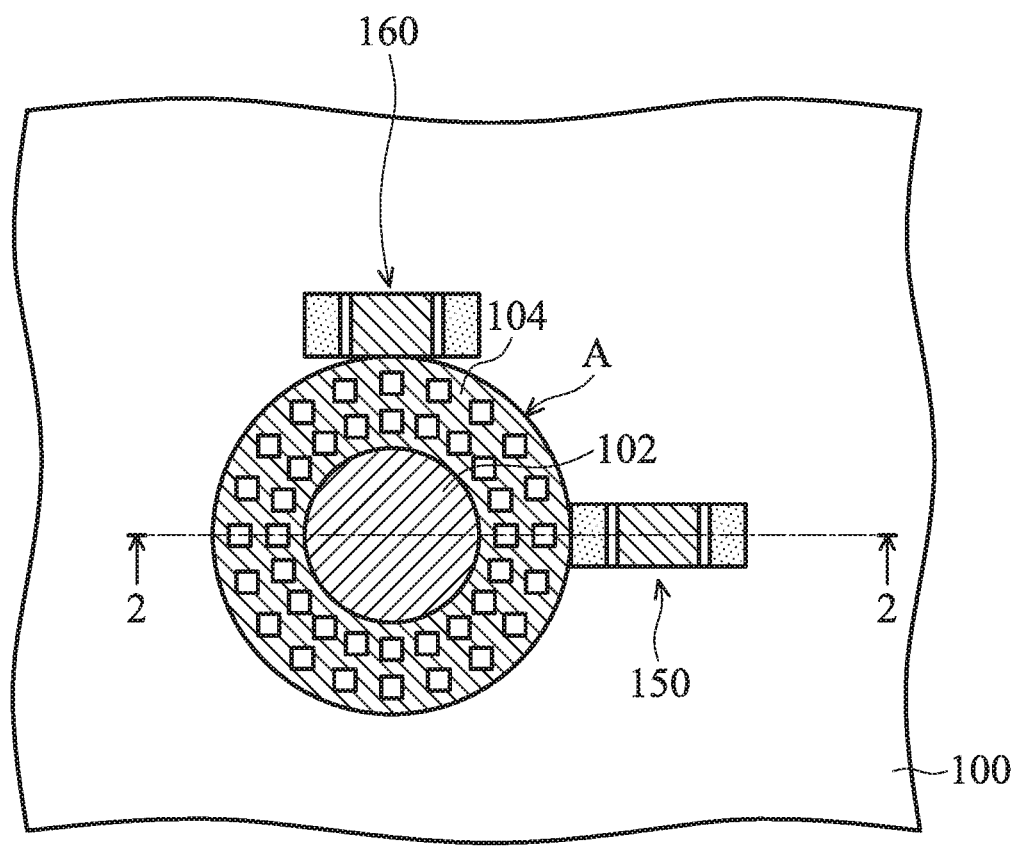
FIG. 1 is a schematic top view showing a semiconductor structure with a through-silicon via (TSV) according to an embodiment of the invention.
Figure 2:
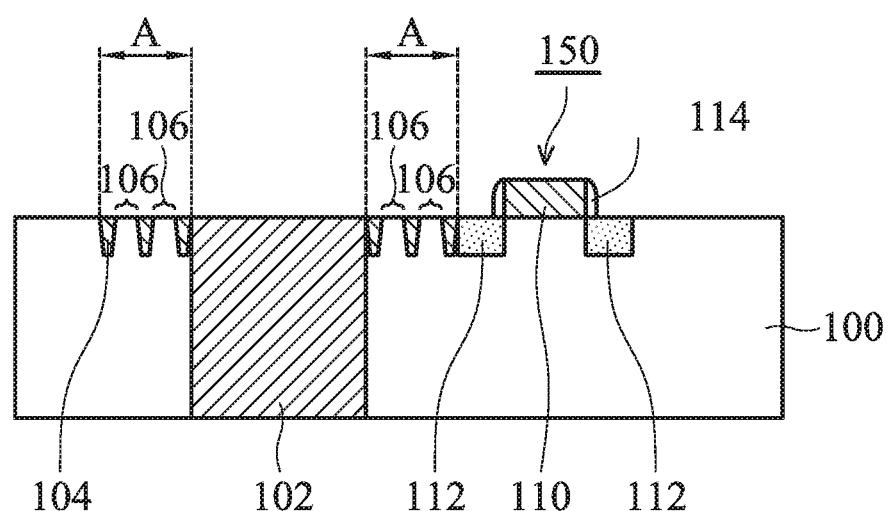
FIG. 2 is a schematic cross section showing the semiconductor structure with a through-silicon via (TSV) along a line 2-2 in FIG. 1.

FIGS. 1-2 are schematic diagrams showing an exemplary semiconductor structure with a through-silicon via (TSV).

FIG. 1 is a schematic top view showing the semiconductor structure with a through-silicon via (TSV), and FIG. 2 is a schematic cross section showing the semiconductor structure with the through-silicon via (TSV) along a line 2-2 in FIG. 1.

As shown in FIGS. 1 and 2, the semiconductor structure mainly comprises a semiconductor substrate 100, a conductive element 102, a plurality of insulating elements 104, and two semiconductor devices 150 and 160.

In addition, the semiconductor structure shown in FIGS. 1 and 2 may further comprise other components (not shown) formed under and/or over the semiconductor substrate 100 for forming a 3-dimensional (3D) integrated circuit package (not shown), but these components are not shown and disclosed in FIGS. 1 and 2 for purposes of clarity and easy understanding.

Referring to FIGS. 1 and 2, in one embodiment, the semiconductor substrate 100 may comprise a semiconductor material such as silicon or the like. The conductive element 102 may be formed in a portion of the semiconductor substrate 100 and penetrates the semiconductor substrate 100, thereby functioning as a through-silicon via (TSV) for connecting other components (not shown) formed over and/or below the semiconductor substrate 100.

As shown in FIGS. 1 and 2, the conductive element 102 is illustrated as a conductive pillar formed in the semiconductor substrate 200 having a circular top view.

In one embodiment, the conductive element 102 may comprise a conductive material such as copper or other conductive materials, and a diffusion barrier layer (not shown) may be provided at an interface between the conductive element 102 and the semiconductor substrate 100 to prevent atoms in the conductive element 102 from being diffused into the adjacent semiconductor substrate 100.

Still referring to FIGS. 1 and 2, the plurality of insulating elements 104 formed in various portions of the semiconductor substrate 100 at a region A entirely surrounding the conductive element 102. Accordingly, a plurality of semiconductor sub-regions 106 are thus defined over the semiconductor substrate 100 in region A by the insulating elements 104.

In one embodiment, the insulating elements 104 may be shallow-trench-isolation (STI) elements comprising insulating materials such as silicon oxide. Although the insulating elements 104 shown in FIG. 2 are illustrated as insulating elements isolated from each other, but the insulating elements 104 are partially connected with each other to form a grid-like pattern from a top view, see FIG. 1.

The semiconductor sub-regions 106 in region A shown in FIGS. 1-2 are portions of the semiconductor substrate 100 having similar patterns and sizes which are isolated from each other by the insulating elements 104. In one embodiment, the semiconductor sub-regions 106 can be formed with an array-like configuration from a top view, and an overall area of the semiconductor sub-regions 106 is about 15% to about 60% of an overall area of the region A. In one embodiment, the semiconductor sub-regions 106 may have a rectangular shape from the top view. In other embodiments, the semiconductor sub-regions 106 may have a shape other than the rectangular shape from the top view shown in FIG. 1.

As shown in FIGS. 1 and 2, the semiconductor device 150 is formed at a first side, for example the right side (see FIG. 1), of the conductive element 102, and the semiconductor device 160 is formed a second side, for example the upper side (see FIG. 1) of the conductive element 104. Region A is formed between the conductive element 102 and the semiconductor devices 150 and 160, and the semiconductor devices 150 and 160 are adjacent to an outer edge of the region A.

The semiconductor devices 150 and 160 can be, for example, metal-oxide-semiconductor (MOS) transistors formed over the semiconductor substrate 100, each comprising a gate stack 110 including a gate dielectric layer (not shown) and a gate electrode (not shown) sequentially formed over the semiconductor substrate 100, a pair of doped regions 112 formed in the semiconductor substrate 100 on opposite sides of the gate stack 110, and a pair of sidewall spacers 114 formed on opposite sidewalls of the gate stack 110. The semiconductor devices 150 and 160 can be formed with the same conductivity type or with different conductivity types.

Therefore, in one embodiment, the semiconductor devices 150 and 160 can both be n-type MOS (NMOS) transistors or p-type MOS (PMOS) transistors. In another embodiment, one of the semiconductor devices 150 and 160, for example the semiconductor device 150, can be a PMOS transistor, and the other one of the semiconductor devices 150 and 160, for example the semiconductor device 160, can be a NMOS transistor.

In the semiconductor structure shown in FIGS. 1 and 2, since the conductive materials in the conductive element 102 for functioning as a through-silicon via (TSV) element may induce tensile stress which is undesired to the semiconductor devices 150 and 160 toward the surrounding semiconductor substrate 100. Therefore, region A provided between the conductive element 102 and the semiconductor devices 150 and 160 may function as a keep-out Zone (KOZ) for keeping the conductive element 102 at a distance apart from semiconductor devices 150 and 160 formed over the semiconductor substrate 100 in order to avoid degrading the devices' performance due to tensile stress. No semiconductor device is formed in the semiconductor substrate 100 in the region A.

Due to the formation of the plurality of insulating elements 104 in the region A, insulating materials for forming the insulating elements 104 induce compressive stress in the surrounding semiconductor substrate 100 to compromise the tensile stress in the semiconductor substrate 100 induced by formation of the conductive element 102.

Therefore, the distance from the outer edge of region A to the outer edge of the conductive element 102 can be reduced when compared with a conventional keep-out Zone (KOZ) merely defined by a semiconductor region around a given TSV. In one embodiment, the distance from the outer edge of region A to the outer edge of the conductive element 102 can be less than 3 and device shifts of the semiconductor devices 150 and 160 shown in FIGS. 1-2 affected by the tensile stress induced by the conductive element 102 can be reduced to less than 3%, or even prevented.

Accordingly, the semiconductor structure shown in FIGS. 1-2 can be provided with a keep-out Zone (KOZ, i.e. the region A) having a reduced area over the semiconductor substrate 100, and device shifts of the semiconductor devices 150 and 160 shown in FIGS. 1-2 affected by the tensile stress induced by the conductive element 102 can be reduced to less than 3%, or even prevented. Therefore, the maximum area over the semiconductor substrate for forming the device circuits such as the semiconductor devices 150 and 160 can be increased to be compliant with the size-reduced keep-out zone (i.e. the region A) shown in FIGS. 1-2

In one embodiment, region A and the conductive element 102 of the semiconductor structure shown in FIGS. 1-2 are formed with the same configurations (e.g. circular configuration) from the top view. However, region A and the conductive element 102 of the semiconductor structure can be formed with different configurations from the top view.

Figure 3:
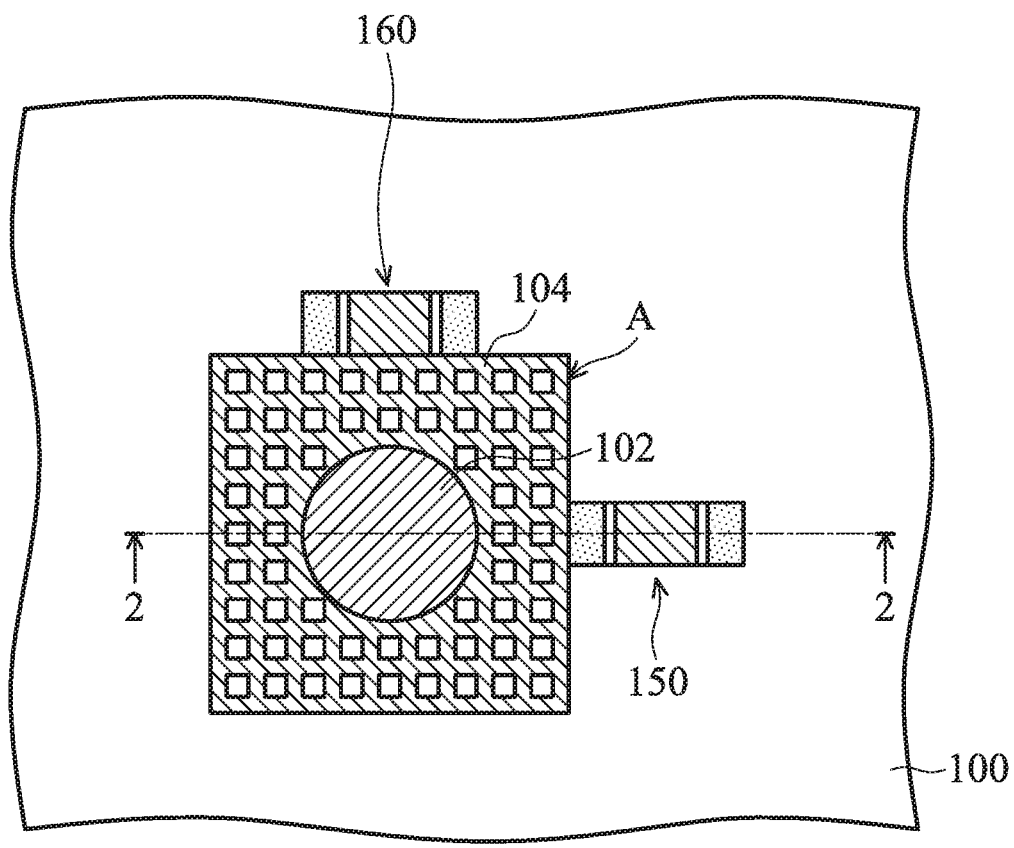
FIG. 3 is a schematic top view showing a semiconductor structure with a through-silicon via (TSV) according to another embodiment of the invention.

FIG. 3 is a schematic top view showing another exemplary semiconductor structure with a through-silicon via (TSV). In this embodiment, region A and the conductive element 102 of the semiconductor structure can be formed with different configurations from the top view. As shown in FIG. 3, the conductive element 102 is formed with a circular configuration from the top view, and region A is formed with a rectangular configuration from the top view, which is different from that of the conductive element 102. In other embodiments, region A and the conductive element 102 of the semiconductor structure can be formed with other configurations from the top view and are not limited by those disclosed in FIGS. 1 and 3.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
a semiconductor substrate comprising silicon;
a conductive element formed as a through-silicon via extending through a portion of the semiconductor substrate;
a plurality of insulating elements formed in portions of the semiconductor substrate at a first region surrounding the conductive element; and
a semiconductor device formed over a portion of the semiconductor substrate at a second region adjacent to the first region, wherein the first region is formed between the conductive element and the second region;
wherein the plurality of insulating elements are partially connected to form a grid-like pattern from a top view, thereby defining a plurality of semiconductor sub-regions in the semiconductor substrate at the first region surrounding the conductive element;
wherein the plurality of semiconductor sub-regions are isolated from each other and are configured as an array having a first row of semiconductor sub-regions of substantially the same size arranged along a first direction, a second row of semiconductor sub-regions of substantially the same size arranged along the first direction,
wherein the first row of semiconductor sub-regions is aligned with the second row of semiconductor sub-regions along a second direction orthogonal to the first direction, wherein the first direction and the second direction are parallel to a top surface of the semiconductor substrate.

2. The semiconductor structure as claimed in claim 1, wherein the conductive element comprises copper.

3. The semiconductor structure as claimed in claim 1, wherein the plurality of insulating elements are shallow-trench-isolation (STI) elements formed in the semiconductor substrate.

4. The semiconductor structure as claimed in claim 3, wherein the shallow-trench-isolation (STI) elements comprises silicon oxide.

5. The semiconductor structure as claimed in claim 1, wherein an overall area of the plurality of semiconductor sub-regions is about 15% to about 60% of an area of the first region.

6. The semiconductor structure as claimed in claim 1, wherein a distance from an outer edge of the first region to an outer edge of the conductive element is less than 3 µm and a device shift of the semiconductor device affected by stress induced by the conductive element is reduced to less than 3%.

7. A semiconductor structure, comprising:
a semiconductor substrate;
a conductive element formed in a portion of the semiconductor substrate;
a plurality of semiconductor sub-regions separately formed in the semiconductor substrate at a first region surrounding the conductive element;
wherein a semiconductor sub-region of the plurality of semiconductor sub-regions comprises a surface aligned with a top surface of the conductive element, and
a semiconductor device formed over a portion of the semiconductor substrate at a second region adjacent to the first region, wherein the first region is formed between the conductive element and the second region;
wherein the plurality of semiconductor sub-regions are configured as an array having a concentric orientation about the conductive element.

8. The semiconductor structure as claimed in claim 7, further comprising a plurality of isolation elements formed in the semiconductor substrate at the first region surrounding the conductive element to define the plurality of semiconductor sub-regions.

9. The semiconductor structure as claimed in claim 7, wherein the semiconductor substrate comprises silicon, and the conductive element is a through-silicon via formed through the semiconductor substrate.

10. The semiconductor structure as claimed in claim 7, wherein the conductive element comprises copper.

11. The semiconductor structure as claimed in claim 7, wherein the plurality of insulating elements are shallow-trench-isolation (STI) elements formed in the semiconductor substrate.

12. The semiconductor structure as claimed in claim 11, wherein the plurality of insulating elements are partially connected.

13. The semiconductor structure as claimed in claim 7, wherein an overall area of the plurality of semiconductor sub-regions is about 15% to about 60% of an area of the first region.

14. The semiconductor structure as claimed in claim 7, wherein a distance from an outer edge of the first region to an outer edge of the conductive element is less than 3 µm and a device shift of the semiconductor device affected by stress induced by the conductive element is reduced to less than 3%.

15. A semiconductor structure, comprising:
a semiconductor substrate;
a conductive element formed in a portion of the semiconductor substrate;
a plurality of insulating elements formed in portions of the semiconductor substrate at a first region surrounding the conductive element;
a first semiconductor element formed over a portion of the semiconductor substrate at a second region adjacent to the first region, wherein the first region is formed between a first side of the conductive element and the second region; and a second semiconductor element formed over a portion of the semiconductor substrate at a third region adjacent to the first region, wherein the first region is formed between a second side of the conductive element and the third region, wherein the second side is perpendicular to the first side;

wherein the plurality of insulating elements are partially connected to form a grid-like pattern from a top view, thereby defining a plurality of semiconductor sub-regions in the semiconductor substrate at the first region surrounding the conductive element;

wherein the plurality of semiconductor sub-regions are isolated from each other and are configured as an array having a first row of semiconductor sub-regions of substantially the same size arranged along a first direction, a second row of semiconductor sub-regions of substantially the same size arranged along the first direction, wherein the first row of semiconductor sub-regions is aligned with the second row of semiconductor sub-regions along a second direction orthogonal to the first direction, wherein the first direction and the second direction are parallel to a top surface of the semiconductor substrate.

16. The semiconductor structure as claimed in claim 15, wherein the semiconductor substrate comprises silicon, and the conductive element is a through-silicon via formed through the semiconductor substrate.

17. The semiconductor structure as claimed in claim 15, wherein an overall area of the plurality of semiconductor sub-regions is about 15% to about 60% of an area of the first region.

18. The semiconductor structure as claimed in claim 15, wherein a distance from the first semiconductor device to an outer edge of the conductive element is less than 3 μm and device shifts of the first and semiconductor devices affected by stress induced by the conductive element is reduced to less than 3%.

19. The semiconductor structure as claimed in claim 15, wherein the first semiconductor device is a p-type metal-oxide-semiconductor (PMOS) device, and the second semiconductor device is a n-type metal-oxide-semiconductor (NMOS) device.

20. The semiconductor structure as claimed in claim 1, wherein the array has an outer array and an inner array and, in top view, a shape of the outer array corresponds to a shape of an outer edge of the first region.

21. The semiconductor structure as claimed in claim 20, wherein, in top view, a shape of the inner array corresponds to the shape of the outer edge of the first region.

22. The semiconductor structure as claimed in claim 20, wherein the shape of the outer array is different than a shape of the conductive element.

* * * * *